United States Patent [19]

Kawashima et al.

[11] Patent Number: 5,444,736
[45] Date of Patent: Aug. 22, 1995

[54] RADIO COMMUNICATION APPARATUS HAVING AN AUTOMATIC FREQUENCY CONTROL CIRCUIT FOR CONTROLLING A TRANSMISSION FREQUENCY ON THE BASIS OF A RECEPTION FREQUENCY

[75] Inventors: Kazuhiro Kawashima, Yokohama; Mutsumu Serizawa, Tokyo, both of Japan

[73] Assignee: Kabushiki Kaisha Toshiba, Kawasaki, Japan

[21] Appl. No.: 915,674

[22] Filed: Jul. 21, 1992

[30] Foreign Application Priority Data

Jul. 22, 1991 [JP] Japan .................. 3-181265

[51] Int. Cl.⁶ .................. H04B 1/38; H04L 5/16
[52] U.S. Cl. .................. 375/219; 455/192.2; 375/343; 375/344; 375/238
[58] Field of Search .................. 375/22, 81, 97, 7, 96; 455/182.1, 182.2, 192.1, 192.2, 255, 256, 257, 258, 259, 264, 265

[56] References Cited

U.S. PATENT DOCUMENTS

| | | | |
|---|---|---|---|
| 3,080,524 | 3/1963 | Davey et al. | 325/187 |
| 4,607,215 | 8/1986 | Takano et al. | 324/77 |
| 4,817,192 | 3/1989 | Phillips et al. | 375/97 |
| 4,829,543 | 5/1989 | Borth et al. | 375/96 |
| 4,931,751 | 6/1990 | Keller et al. | 332/108 |
| 4,958,360 | 9/1990 | Sari | 375/97 |
| 4,989,074 | 1/1991 | Matsumoto | 358/21 |
| 5,012,491 | 4/1991 | Iwasaki | 375/96 |
| 5,142,695 | 8/1992 | Roberts et al. | 455/89 |
| 5,200,977 | 4/1993 | Ohnishi et al. | 375/97 |

FOREIGN PATENT DOCUMENTS

| | | | |
|---|---|---|---|
| 0154859 | 11/1981 | Japan | 375/97 |
| 3117222 | 5/1994 | Japan . | |

*Primary Examiner*—Stephen Chin
*Assistant Examiner*—Don Vo
*Attorney, Agent, or Firm*—Banner, Birch, McKie & Beckett

[57] ABSTRACT

A radio communication apparatus comprises a detecting circuit for detecting a change of a received frequency of a radio communication channel during a communication and outputting a digital detection signal, a pulse width modulating circuit, and a smoothing circuit. The pulse width modulating circuit pulse-width modulates a pulse signal having a predetermined frequency in accordance with the digital detection signal output from the detecting circuit. The smoothing circuit smoothes the pulse-width modulated circuit output from the pulse width modulating circuit and generates an analog control signal. A transmission local oscillating frequency is controlled in accordance with the analog control signal.

12 Claims, 7 Drawing Sheets

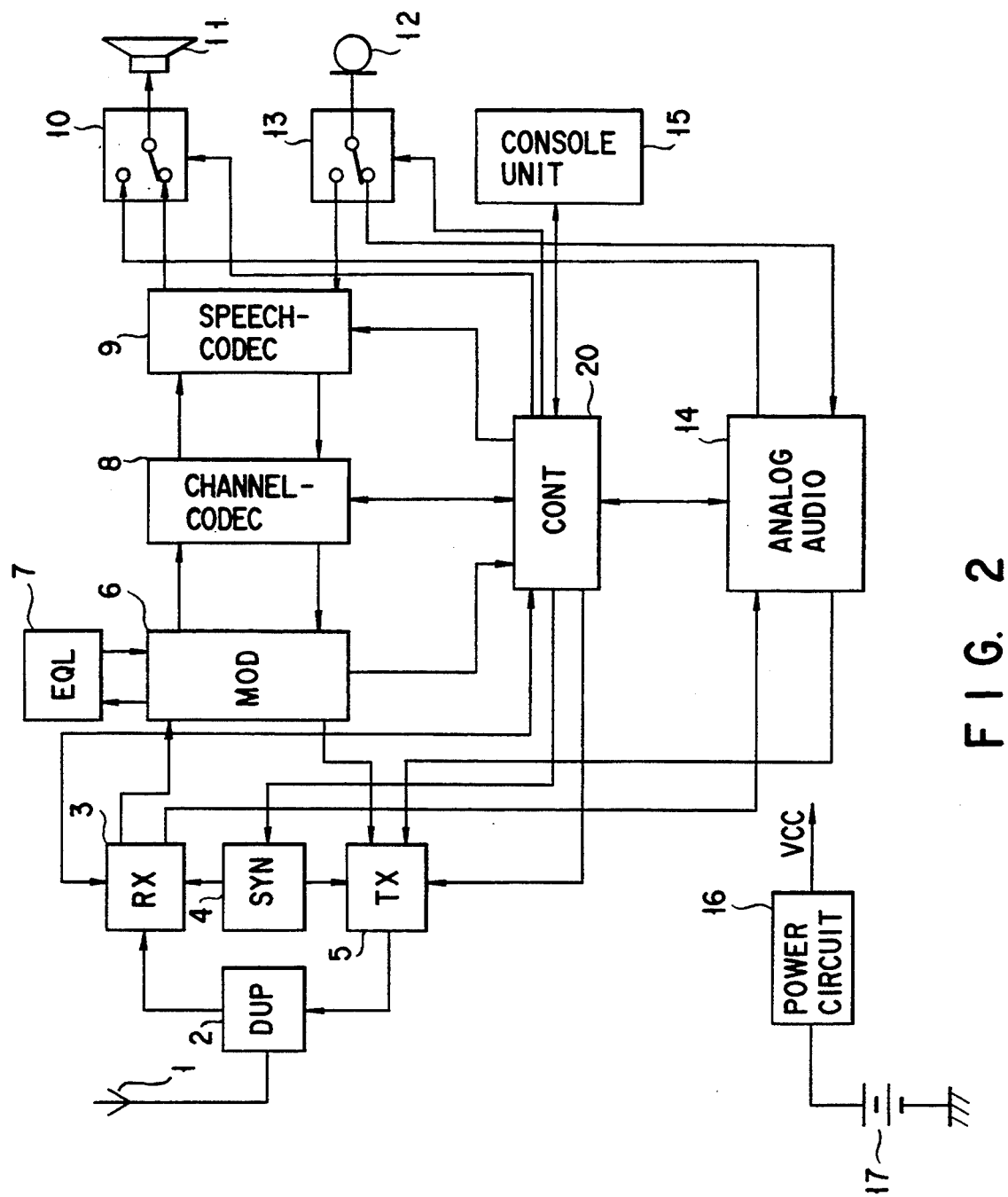
F I G. 2

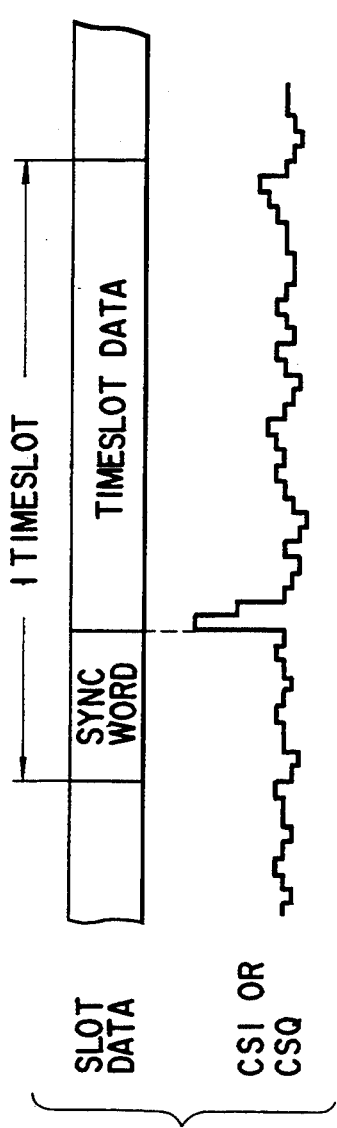
F I G. 5
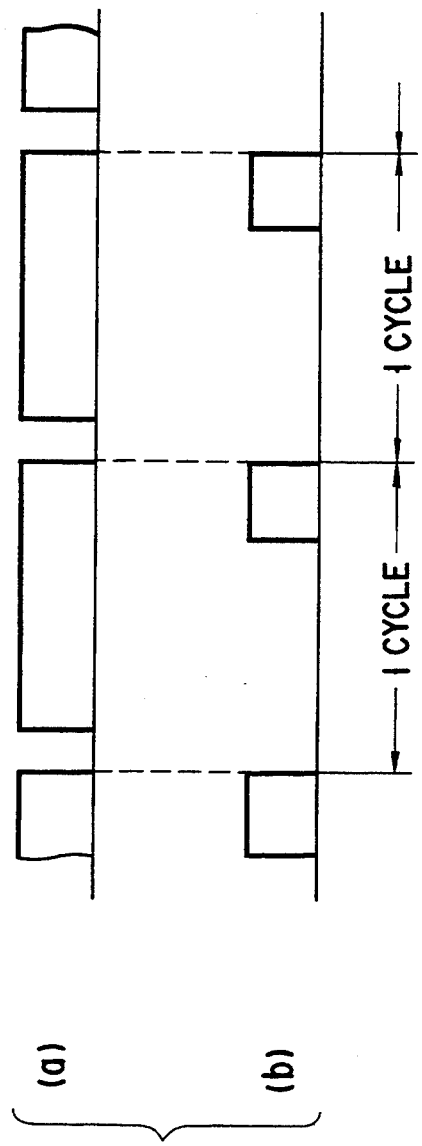
F I G. 6

| FREQUENCY CHANGE | ΔF | LINEAR CHANGE SIGNAL | LOG CHANGE SIGNAL |
|---|---|---|---|
| 7 | 0 1 1 1 | 1 1 1 1 | 1 1 1 1 |
| 6 | 0 1 1 0 | 1 1 1 0 | 1 1 1 1 |
| 5 | 0 1 0 1 | 1 1 0 1 | 1 1 1 1 |
| 4 | 0 1 0 0 | 1 1 0 0 | 1 1 1 1 |
| 3 | 0 0 1 1 | 1 0 1 1 | 1 1 1 1 |
| 2 | 0 0 1 0 | 1 0 1 0 | 1 1 1 1 |
| 1 | 0 0 0 1 | 1 0 0 1 | 1 1 1 1 |
| 0 | 0 0 0 0 | 1 0 0 0 | 1 1 1 1 |
| −1 | 1 1 1 1 | 0 1 1 1 | 0 1 1 1 |
| −2 | 1 1 1 0 | 0 1 1 0 | 0 1 1 1 |
| −3 | 1 1 0 1 | 0 1 0 1 | 0 1 1 1 |
| −4 | 1 1 0 0 | 0 1 0 0 | 0 1 1 1 |
| −5 | 1 0 1 1 | 0 0 1 1 | 0 0 1 1 |
| −6 | 1 0 1 0 | 0 0 1 0 | 0 0 1 1 |
| −7 | 1 0 0 1 | 0 0 0 1 | 0 0 0 1 |
| −8 | 1 0 0 0 | 0 0 0 0 | 0 0 0 0 |

F I G. 7

RADIO COMMUNICATION APPARATUS HAVING AN AUTOMATIC FREQUENCY CONTROL CIRCUIT FOR CONTROLLING A TRANSMISSION FREQUENCY ON THE BASIS OF A RECEPTION FREQUENCY

BACKGROUND OF THE INVENTION

1. Field of the Invention

The present invention relates to a radio communication apparatus such as mobile telephones, portable telephones, and cordless telephones, and more particularly to a radio communication apparatus having an automatic frequency control circuit for controlling a frequency on the basis of a reception frequency.

2. Description of the Related Art

In general, a radio communication apparatus used as a mobile station of a mobile/portable telephone system comprises an automatic frequency control (AFC) circuit. The AFC circuit controls a transmitting channel frequency on the basis of a received channel frequency of a radio signal transmitted from a base station, and is constructed as follows, for example. A radio signal received through an antenna is frequency-converted to an intermediate frequency signal by a receiver, and thereafter demodulated to a baseband signal by a demodulator. A change of the reception channel frequency is detected by a difference detecting circuit on the basis of a signal obtained in the process of receiving and demodulation. The detected value of the change of the reception channel frequency is supplied to a synthesizer. The synthesizer variably controls a transmission local oscillating frequency. As a result, the transmission channel frequency changes following the reception channel frequency. With the radio communication apparatus having this AFC circuit, the transmission channel frequency can be maintained at a stable value on the basis of the accurate radio channel frequency of a signal transmitted from the base station.

Recently, a radio communication apparatus having a digital mode has been developed. In a digital mode, a speech signal is encoded, and a carrier wave signal is digital-modulated by the encoded speech signal and transmitted. In a radio communication apparatus of this type, a modulator/demodulator is constituted by a digital circuit, which includes a difference detecting circuit of an AFC circuit.

The AFC circuit as described above has the following drawbacks:

The synthesizer is operated by an analog control voltage, whereas the difference detecting circuit outputs a digital difference signal. Hence, to operate the synthesizer in response to a digital difference signal output from the difference detecting circuit, a D/A converter for converting the digital differential signal to an analog signal. Since, in general, a D/A converter is large and consumes considerable amount of power, it is difficult to reduce the size of a radio communication apparatus and to increase the continuous operation time.

In addition, if a difference detecting circuit is integrated with a digital modulation/demodulation circuit, the large scale integrated circuit must have a large number of terminals to output a digital difference signal. Hence, it is difficult to make an LSI package compact. For example, to control a frequency with a satisfactory accuracy, 8 to 16 bits are required to transmit a digital difference signal, and providing an integrated circuit with terminals corresponding in number to the bits is considerably disadvantageous to decrease the size of the large scale integrated circuit.

SUMMARY OF THE INVENTION

A first object of the present invention is to provide a radio communication apparatus which controls a frequency without using a D/A converter and permits the circuit scale to be reduced and the power consumption to be lowered.

A second object of the present invention is to provide a radio communication apparatus in which an integrated circuit for frequency control comprises a reduced number of terminals, thereby reducing the size of the entire circuit, as well as that of the integrated circuit.

A third object of the present invention is to provide a radio communication apparatus which controls a frequency with high accuracy.

A fourth object of the present invention is to provide a radio communication apparatus which controls a frequency at a high speed.

A fifth object of the present invention is to provide a radio communication apparatus which controls a frequency with high accuracy at a high speed.

A sixth object of the present invention is to provide a radio communication apparatus in which a change in a reception channel frequency can be detected relatively easily by a digital process.

To achieve the first and second objects, the radio communication apparatus according to the present invention comprises a detecting circuit for detecting a change in a reception frequency in a radio communication channel during communication and outputting a digital detection signal, a pulse width modulation circuit, and a smoothing circuit. In the pulse width modulation circuit, the pulse width of a pulse signal having a predetermined frequency is modulated in accordance with the digital detection signal output from the detecting circuit. The pulse signal whose pulse width has been modulated is smoothed by the smoothing circuit and converted to an analog control signal. The analog control signal controls a transmission local oscillating frequency.

Thus, according to the present invention, an analog control signal necessary to control an oscillating frequency of a frequency synthesizer is generated by the pulse width modulation circuit and the smoothing circuit. Therefore, since a D/A converter is not required, the structure of the automatic frequency control circuit is simplified and the power consumption is lowered. As a result, the entire structure of the apparatus is simplified and compact and the service life of the battery can be prolonged. These effects are quite advantageous to produce a compact and light portable telephone and to prolong the continuous operation time of a portable telephone.

In addition, since the radio communication apparatus of the present invention uses the pulse width modulation circuit as a circuit for generating an analog control signal, if the detecting circuit and the pulse width modulation circuit are formed in an integrated circuit together with a digital demodulation circuit, it is possible to provide a simple and compact integrated circuit having a small number of terminals. In other words, the second object can be achieved. By contrast, in the case that a D/A converter is used as a circuit for generating an analog control signal, it is difficult to integrate the D/A converter with a digital demodulation circuit, since the D/A converter is complicated and large. If the D/A converter is formed outside an integrated circuit including a digital demodulation circuit, the integrated circuit cannot be compact, since a number of terminals for outputting a digital detection signal must be formed on the integrated circuit.

To achieve the third object, according to the present invention, the pulse width modulation circuit outputs a linear pulse width modulation signal, whose pulse width has been modulated in accordance with the digital detection signal output from the detecting circuit. As a result, the pulse width modulation circuit generates an analog control signal which varies linearly in accordance with a change of a reception channel frequency, in accordance with which a transmission channel frequency is controlled. Hence, it is possible to perform an accurate frequency control.

To achieve the fourth object, according to the present invention, the pulse width modulation circuit outputs a log pulse width modulation signal, whose pulse width has been modulated in accordance with a signal obtained by log-converting the digital detection signal output from the detecting circuit. As a result, the pulse width modulation circuit generates an analog control signal which varies logarithmically in accordance with a change of a reception channel frequency, in accordance with which a transmission channel frequency is controlled. Therefore, even if the reception channel frequency varies greatly, it is possible to make a transmission channel frequency follow the reception channel frequency at a high speed.

To achieve the fifth object, according to the present invention, the pulse width modulation circuit generates a linear pulse width modulation signal, whose pulse width has been modulated in accordance with the digital detection signal output from the detecting circuit, and also a log pulse width modulation signal, whose pulse width has been modulated in accordance with a signal obtained by log-converting the digital detection signal. The pulse width modulation circuit compares the value indicated by the digital detection signal with a predetermined threshold value. If the digital detection signal is the same as or greater than the threshold value, the log pulse width modulation signal is selected and output. If the digital detection signal is less than the threshold value, the linear pulse width modulation signal is selected and output.

Thus, according to the present invention, when the amount of change of the reception channel frequency is the same as or greater than the threshold value, a log pulse width modulation signal is selected, and when the amount is smaller than the threshold value, a linear pulse width modulation signal is selected. Therefore, a transmission channel frequency can be controlled at a higher speed and more accurately as compared to the case in which only one of a linear pulse width modulation signal and a log pulse width modulation signal is used. As a result, even if a radio communication channel is handed off by another channel or greatly deviated, the frequency can be corrected accurately within a short period of time.

To achieve the sixth object, according to the present invention, the detecting circuit comprises a memory circuit for storing a plurality of change detection patterns which have been set in accordance with the amounts of change of the reception channel frequency. The detecting circuit obtains correlations between a received digital signal input to the memory circuit and the plurality of change detection patterns, and detects the amount of change of the reception channel frequency on the basis of the correlations. In this manner, the change of the reception channel frequency can be detected relatively easily by a digital process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 2 is a block diagram showing a portable telephone used in the system shown in FIG. 1;

FIG. 5 is a signal waveform diagram for explaining an operation of detecting a change of the reception channel frequency;

FIG. 6 is a signal waveform diagram showing an example of the pulse width modulation signal; and FIG. 7 is a diagram showing an example of the relationship among the frequency change detection data, the linear change signal, and the log change signal.

DETAILED DESCRIPTION OF THE PREFERRED EMBODIMENT

An embodiment in which the present invention is applied to an mobile/portable radio telephone system will be described.

The system of this embodiment is of a dual-mode-type. The dual mode is a method wherein an analog mode and a digital mode are selectively used to perform radio communication. In the analog mode, a carrier wave is, for example, FM-modulated with an analog speech signal in a transmission circuit, and then, the modulated carrier wave signal is transmitted. In the digital mode, a speech signal is converted and encoded to a digital signal, and a carrier wave is modulated with the encoded speech signal by a digital modulation system such as the $\pi/4$ shifted DQPSK (Differentially Encoded Quadrature Phase Shift Keying) modulation system, and then the modulated carrier wave signal is transmitted.

Figure 1:
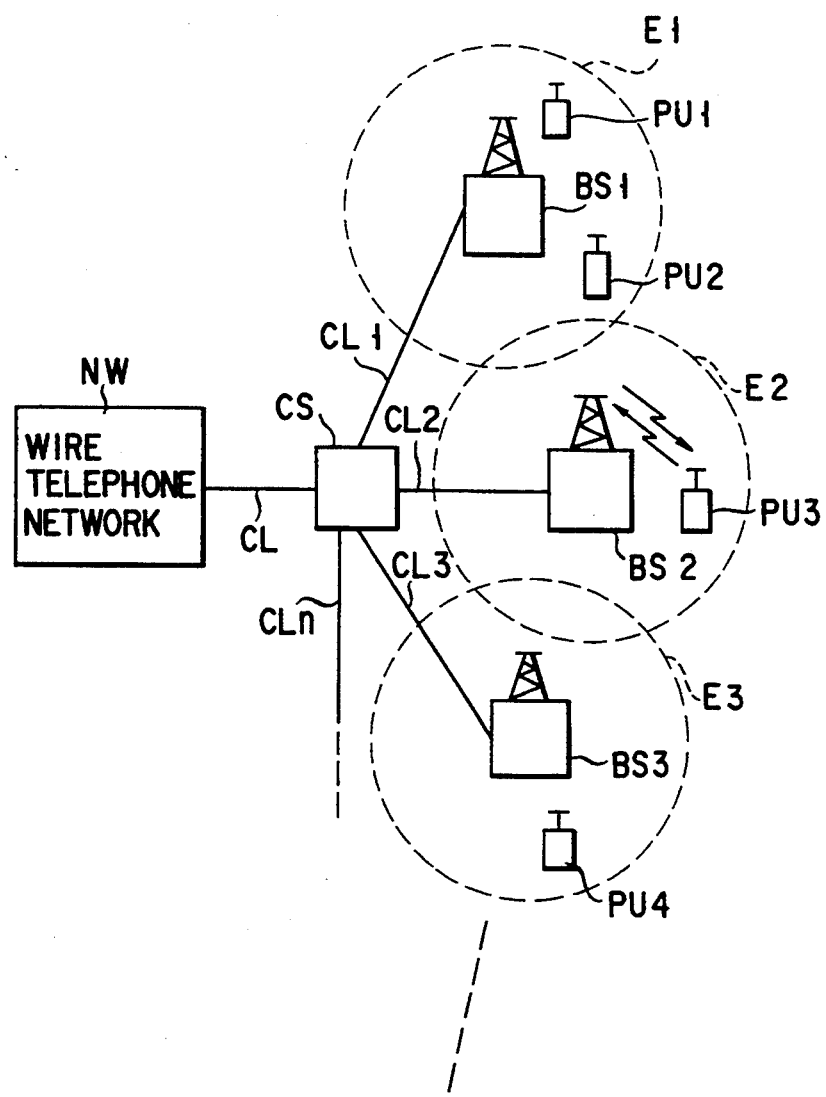
FIG. 1 is a schematic diagram showing the structure of a cellular radio communication system according to an embodiment of the present invention.

FIG. 1 is a schematic diagram showing the mobile/portable radio telephone communication system of the present embodiment. The system comprises a control station CS, a plurality of base stations BS1–BS3, and a plurality of mobile units PU1–PU4. The control station CS is connected to a wire telephone network NW through a wire circuit line CL. The base stations BS1–BS3 are connected to the control station CS through wire circuit lines CL1–CL3, respectively. The base stations BS1–BS3 have radio zones E1–E3, respectively. The mobile units PU1–PU4 are connected to the base stations BS1–BS3 through radio channels in the radio zones E1–E3 of the base stations BS1–BS3. The radio channels are classified into a control channel group and a communication channel group. The communication channel group includes a plurality of analog communication channels for use in the analog mode and a plurality of digital communication channels for use in the digital mode.

FIG. 2 is a block diagram showing the structure of a dual-mode portable telephone unit used as one of the mobile units PU1–PU4.

When the digital mode is set, analog switches 10 and 13 are connected to a speech-encoder/decoder (hereinafter referred to as speech-codec) 9 in accordance with an instruction of a controller 20. A radio signal transmitted from one of the base stations BS1–BS3 through a digital communication channel is received by an antenna 1 and input to a receiver 3 via a duplexer 2. In the receiver 3, the received radio signal is mixed with a reception local oscillating signal generated by a frequency synthesizer 4 and down-converted to an intermediate frequency signal. The frequency of the reception local oscillating signal generated by the frequency synthesizer 4 is designated by a control signal output from the controller 20. The intermediate frequency signal is converted to a digital signal by an A/D converter (not shown), and then input to a digital modulator/demodulator (hereinafter referred to as Modem) 6. The Modem 6 performs a digital demodulation of the intermediate frequency signal, operation of accomplishing a frame synchronization and a slot synchronization, and the like. Digital demodulation signals obtained by the above-mentioned process include a digital communication signal and a digital control signal. The digital control signal is fetched by the controller 20 and identified therein. An equalizer 7 is attached to the Modem 6. The equalizer 7 equalizes the waveform of a digital demodulation signal output from the Modem 6.

A digital communication signal output from the Modem 6 is input to an error correction channel-encoder/decoder (hereinafter referred to as channel-codec) 8. The channel-codec 8 performs an error correcting and decoding operation for the digital communication signal. A digital demodulation signal output from the channel-codec 8 is input to a speech-encoder/decoder (hereinafter referred to as speech-codec) 9. The speech-codec 9 performs a speech decoding operation for the digital communication signal. The digital communication signal output from the speech-codec 9 is converted to an analog communication signal by a PCM decoder (not shown). The analog communication signal is supplied via an analog switch 10 to a loudspeaker 11 and output as a voice or sound.

A voice uttered by a speaker is received by a microphone 12, converted into an analog transmission signal, and input to a PCM encoder (not shown) via an analog switch 13. The PCM encoder converts the analog transmission signal to a digital transmission signal, which is input to the speech-codec 9. The speech-codec 9 performs a speech coding operation for the digital transmission signal. The digital transmission signal output from the speech-codec 9 is input to the channel-codec 8. The channel-codec 8 performs an error correcting and coding operation for the digital transmission signal. The digital transmission signal after the error correcting and coding operation is supplied to the controller 20, which adds a frame synchronization signal thereto, and then input to the Modem 6. The Modem 6 performs a $\pi/4$ shifted DQPSK modulation with respect to the digital transmission signal and generates a modulation signal. The modulation signal is converted to an analog signal by a D/A converter (not shown) and input to a transmitter 5. The transmitter 5 mixes the modulation signal with a transmission local oscillating signal output from the frequency synthesizer and up-converts it to a radio frequency signal, which is amplified by a high-frequency amplifier. A radio frequency signal output from the transmitter 5 is supplied through the duplexer 2 to the antenna 1, and transmitted to a base station.

When the analog mode is set, analog switches 10 and 13 are connected to an analog audio circuit 14 in accordance with an instruction of the controller 20. The analog audio circuit 14 FM-demodulates an intermediate frequency signal output from the receiver 3, thereby reproducing an analog reception signal. The analog reception signal is supplied via an analog switch 10 to a loudspeaker 11 and output as a voice or sound. On the other hand, a voice uttered by a speaker is received by a microphone 12, converted into an analog transmission signal, and input to the analog audio circuit 14 via the analog switch 13. The analog audio circuit 14 FM-modulates the transmission signal, and generates a modulation signal, which is input to the transmitter 5. The transmitter 5 mixes the modulation signal with a transmission local oscillating signal output from the frequency synthesizer 4 and up-converts it to a radio frequency signal, which is power-amplified. A radio frequency signal output from the transmitter 5 is supplied through the duplexer 2 to the antenna 1, and transmitted to a base station in communication.

The controller 20 comprises a microprocessor (MPU). The MPU is connected to a ROM, RAM, and an input/output port (I/O) via bus lines. The ROM prestores all of the control program required for a radio communication and part of the control data. The RAM stores information input through keys, reception control information, and the like. The MPU executes various control operations relating to the radio communication in accordance with the control program and the control data stored in the ROM and control information stored in the RAM.

A console unit 15 comprises a key switch group and a display. The display is, for example, a liquid crystal display. The key switch group includes a send key, an end key, digit keys for a dialing operation, and a function key. A power source circuit 16 generates a predetermined operation voltage Vcc based on an output voltage of a battery 17 and supplies it to the above circuits.

Figure 3A:
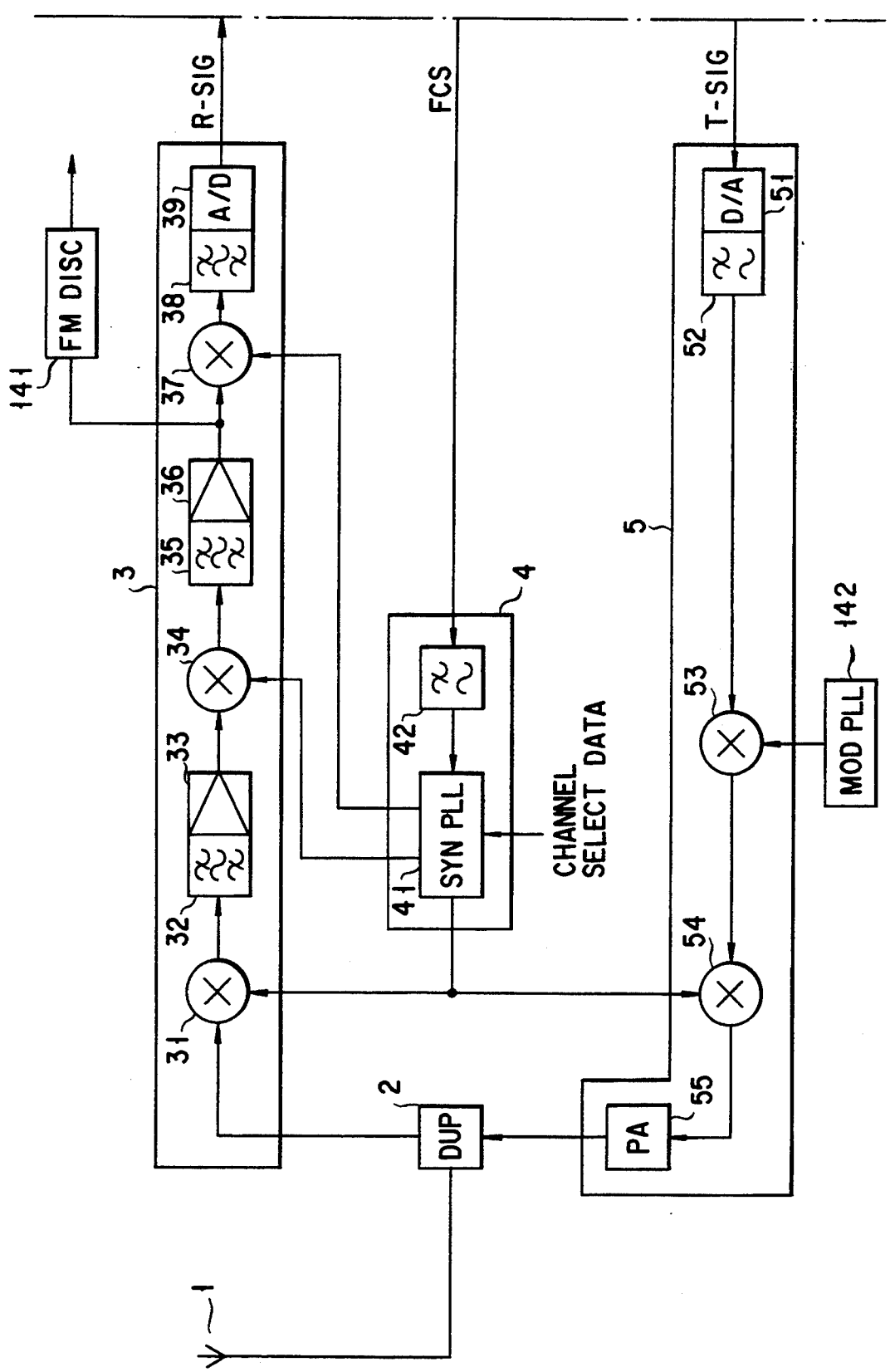
FIGS. 3A and 3B are block diagrams showing the receiver, the transmitter, the digital modulation/demodulation circuit shown in FIG. 2.
Figure 3B:
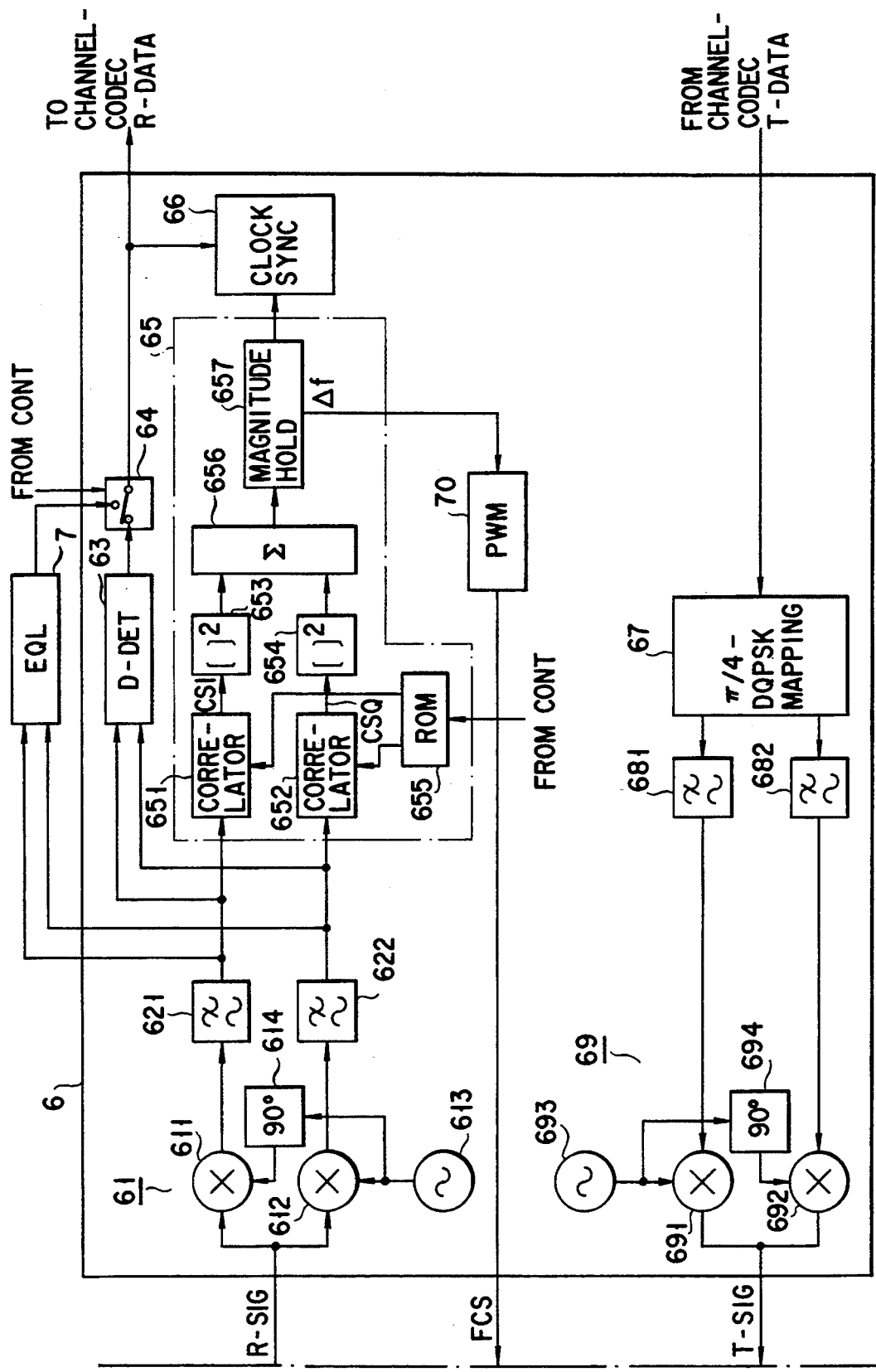

FIGS. 3A and 3B are block diagrams showing the receiver 3, the frequency synthesizer 4, the transmitter 5, and the Modem 6 of the portable telephone unit shown in FIG. 2.

A radio frequency signal input to the receiver 3 is first mixed by a first mixer 31 with a first reception local oscillating signal output from a PLL circuit 41 of the frequency synthesizer 4 and down-converted to a first intermediate frequency signal. The first intermediate frequency signal is input through a first bandpass filter 32 and a first intermediate frequency amplifier 33 to a second mixer 34. In the second mixer 34, the first intermediate frequency signal is mixed with a second reception local oscillating signal output from the PLL circuit 41, and down-converted to a second intermediate frequency signal. The second intermediate frequency signal is input through a second bandpass filter 35 and a second intermediate frequency amplifier 36 to a third mixer 37. In the third mixer 37, the second intermediate frequency signal is mixed with a third reception local oscillating signal generated by the PLL circuit 411 in order to further down-convert the second intermediate frequency signal to a third intermediate frequency signal having a frequency suitable for a digital demodulation process. A third bandpass filter 38 eliminates an unnecessary component of the third intermediate frequency signal. Then, the third intermediate frequency signal is converted to a digital signal by an A/D converter 39 and supplied to the Modem 6. The second intermediate frequency signal output from the second bandpass filter 35 and the second intermediate frequency amplifier 36 is supplied to a discriminator 141 in the analog audio circuit 14.

The third intermediate frequency signal input to the Modem 6 is supplied to an orthogonal demodulator 61. The orthogonal demodulator 61 comprises two mixers 611 and 612, a local oscillator 613, and a $\pi/2$ phase shifter 614. Each of the mixers 611 and 612 mixes the third intermediate frequency signal with a local oscillating signal whose phase $\pi/2$ differs from the third intermediate frequency signal, and outputs a orthogonally-demodulated digital modulation signal. The digital modulation signal is passed through roll-off filters 621 and 622 and input to a differential detector 63, a synchronizing circuit 65, and the equalizer 7. In the differential detector 63, the digital modulation signal, which has been difference-encoded in a base station by the $\pi/4$ shifted DQPSK modulation system, is demodulated into a digital baseband signal by a delay detection process. The equalizer 7 performs equalization of the signal waveform and delay detection, thereby generating a digital baseband signal. Either the digital baseband signal obtained by the differential detector 63 or the digital baseband signal obtained by the equalizer 7 is selected in accordance with the state of a switch 64 and supplied to the channel-codec 8.

On the other hand, a transmission digital signal T-DATA supplied to the Modem 6 from the channel-codec 8 is first input to a mapping circuit 67. In the mapping circuit 67, the transmission digital signal is subjected to a mapping process necessary for the $\pi/4$ shifted DQPSK modulation. After the mapping process, the digital transmission signal is passed through roll-off filters 681 and 682 and input to an orthogonal modulator 69. The orthogonal modulator 69 comprises mixers 691 and 692, a local oscillator 693, and a $\pi/2$ phase shifter 694. Each of the mixers 691 and 692 mixes the mapped transmission digital signal with a local oscillating signal whose phase $\pi/2$ differs from the mapped transmission digital signal, and outputs a orthogonally-modulated digital modulation signal T-SIG. The digital modulation signal T-SIG is input to the transmitter 5. In the transmitter 5, the digital modulation signal T-SIG is first converted to an analog modulation signal by a D/A converter and unnecessary high-frequency components of the signal is eliminated therefrom by a low-pass filter 52. The analog modulation signal is successively input to a first mixer 53 and a second mixer 54. When the digital mode is set, in the first mixer 53, the analog modulation signal is mixed with a local oscillating signal generated by a modulation PLL circuit 142 of the analog audio circuit 14, and up-converted to an intermediate frequency signal. In the second mixer 54, the intermediate frequency signal is synthesized with a local oscillation signal output from the frequency synthesizer 4 and converted to a transmission high-frequency signal. The transmission high-frequency signal is high-frequency amplified by a power amplifier (PA) 55, and thereafter transmitted through the antenna 1 to the base station in communication.

When the analog mode is set, an FM-modulated signal output from a modulation PLL circuit 18 of the analog audio circuit 14 and an local oscillating signal output from the Modem 6 are input to the first mixer 53. Accordingly, the first mixer 53 up-converts the FM-modulated signal by the local oscillating signal to an intermediate frequency signal, which is output to the second mixer 54.

The Modem 6 comprises a synchronizing circuit 65 and a pulse width modulation circuit 70. The synchronizing circuit 65 is constituted by correlator 651 and 652, squaring circuits 653 and 654, a summing circuit 656, a magnitude hold circuit 657, and a ROM 655. The ROM 655 prestores a plurality of detection patterns to detect a change of a reception channel frequency. Synchronous words SYNC1-SYNC6 are inserted into six time slots which constitute a TDMA (time division multiple access) frame. Each of the synchronous words SYNC1-SYNC6 has five frequency detection patterns. The five frequency detection patterns correspond to the amounts of frequency change, i.e., $-2\Delta f$, $-\Delta f$, 0, $+\Delta f$, and $+2\Delta f$. The frequency detection patterns stored in the ROM 655 are selectively read out one by one by the control of the controller 20 and supplied to the correlators 651 and 652. Each of the correlators 651 and 652 obtains correlations between an input digital modulation signal of the synchronous word and the five frequency detection patterns read out in sequence from the ROM, and outputs a correlation detected value. The squaring circuits 653 and 654 perform an operation for obtaining a square of the correlation detected value output from the correlators 651 and 652, respectively. The summing circuit 656 obtains a sum of the squares of the correlation detected values respectively obtained by the squaring circuits 653 and 654. The magnitude hold circuit 657 selects one of the five correlation detected signals output from the summing circuit 656, which has the highest level of all. The amount of frequency change corresponding to the selected correlation detected signal (coarse change) is added to a minute change, which has been detected by a detecting circuit (not shown), thereby obtaining a frequency change detection data $\Delta F$. The frequency change detection data $\Delta F$ is output from the magnitude hold circuit 657 to the pulse width modulation circuit 70.

Figure 4:
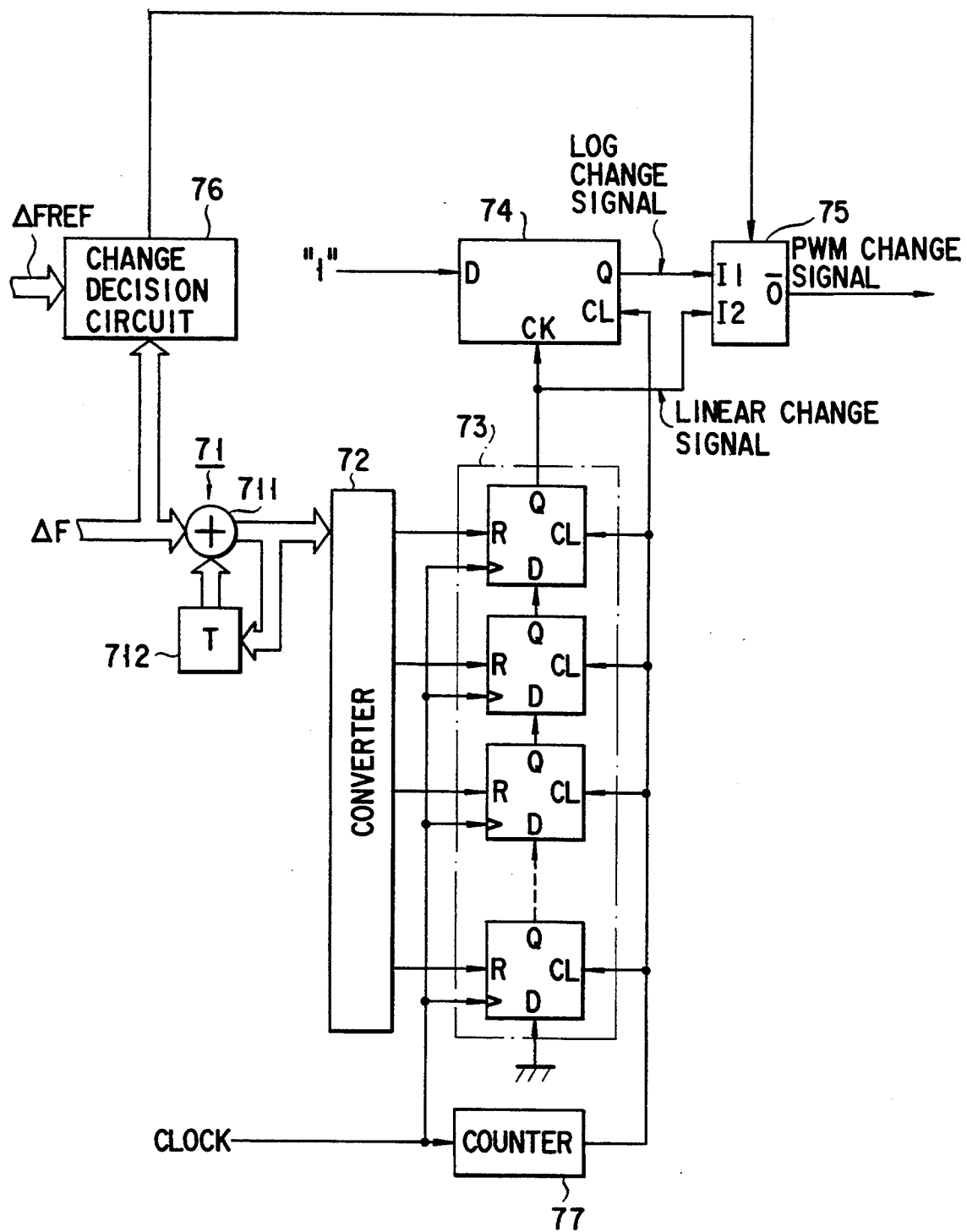
FIG. 4 is a block diagram showing the pulse width modulation circuit in the digital modulation/demodulation circuit shown in FIG. 3B.

The pulse width modulation circuit 70 modulates the pulse width of a pulse signal generated in a predetermined period with the above-mentioned frequency change detection data $\Delta F$, and is constructed as follows. FIG. 4 is a block diagram showing the construction of the pulse width modulation circuit 70.

The pulse width modulation circuit 70 comprises a weighting circuit 71, a compliment converting circuit 72, a parallel/serial (P/S) converting circuit 73, a D flip-flop 74, a gate circuit 75, a change decision circuit 76, and a counter 77. The weighting circuit 71, including a weighting data generating circuit 712 and a summing circuit 711, performs a predetermined weighting operation with respect to the frequency change detection data ΔF supplied from the magnitude hold circuit 657. The complement converting circuit 72 converts the frequency change detection data ΔF to two's complement thereof. The P/S converting circuit 73 is constituted by shift registers having a number of stages corresponding to the number of bits of the frequency change detection data ΔF. The P/S converting circuit converts the frequency change detection data ΔF, i.e., a parallel signal, to a serial signal, in synchronism with a clock signal CLOCK. The serial pulse signal is output as a linear change signal to the D flip-flop 74. The D flip-flop 74 converts the linear change signal to a log change signal, which is input to the gate circuit 75.

The gate circuit 75 selectively allows passage of the linear change signal or the log change signal to the frequency synthesizer 4 in accordance with a decision signal output from the change decision circuit 76. The change decision circuit 76 compares the frequency change detection data ΔF with a preset threshold value. If the detection data ΔF is the same as or greater than the threshold value, the change decision circuit 76 outputs a decision signal to select the log change signal, and if the detection data ΔF is smaller than the threshold value, it outputs a decision signal to select the linear change signal. The counter 77 sets a period of the change signal, which is pulse-width modulated and output from the gate circuit 75. The counter 77 outputs a reset signal for every period to reset the D-flip-flops of the P/S converter 73 and the D flip-flop 74 for log conversion.

An AFC operation of the above-described apparatus will now be described.

Assume that, prior to communication, a base station designates the digital mode and the time slot SYNC1 of a desired radio frequency as a radio communication channel. In this case, channel designation data for designating the radio frequency of the radio communication channel is supplied from the controller 20 to the frequency synthesizer 4. Accordingly, the frequency synthesizer 4 generates a local oscillating signal corresponding to the radio frequency of the radio communication channel. Therefore, in a radio communication period, the receiver 3 receives a radio frequency signal transmitted from the base station through the radio communication channel, and down-converts it to an intermediate frequency signal. The intermediate frequency signal is converted by the A/D converter 39 to a digital signal, which is input to the Modem 6.

In the Modem 6, the intermediate frequency signal is first orthogonally-demodulated by the orthogonal demodulator 61, and converted to a digital modulation signal through the roll-off filters 621 and 622. The digital modulation signal is either subjected to delay detection by the differential detector 63 or equalization of the signal waveform and delay detection by the equalizer 7. As a result, a digital demodulation signal is output from the Modem 6 and supplied to the channel-codec 8.

The digital modulation signal is also input to the synchronizing circuit 65. Every time the synchronizing circuit 65 receives a reception digital modulation signal of the sync word SYNC1, it detects a change of the reception channel frequency based on the signal. More specifically, the preset five frequency change detection patterns corresponding to the sync word SYNC 1 are read out one by one from the ROM 655. The correlators 651 and 652 detect correlations between the digital modulation signal and the five frequency change detection patterns. As a result, each of the correlators 651 and 652 outputs five correlation detected signals CSI and CSQ, for example, as shown in FIG. 5. The five correlation detected signals CSI and CSQ output from the correlators 651 and 652 are squared by the squaring circuits 653 and 654, respectively. The squares obtained by the circuits 653 and 654 are added to each other by the summing circuit 656, and the sum is supplied to the magnitude hold circuit 657. The magnitude hold circuit 657 selects one of the five correlation detected signals, which has the highest level of all. The amount of frequency change corresponding to the selected correlation detected signal (coarse change) is added to a minute change, thereby obtaining a frequency change detection data ΔF. For example, if the level of the correlation detected signal related to the frequency detection pattern corresponding to the amount of frequency change +2Δf is the highest, the sum of the amount of frequency change +2Δf and the minute change is output as a frequency change detection data ΔF to the pulse width modulation circuit 70.

Thus, a frequency change in the time slot is detected. In the same manner, each time the apparatus receives a time slot, a frequency change of the reception channel is detected on the basis of the correlation between the digital modulation signal and the frequency detection pattern.

When the magnitude hold circuit 657 of the synchronizing circuit 65 outputs a frequency change detection data ΔF, the pulse width modulation circuit 70 operates as follows. The frequency change detection data ΔF is converted to a two's complement thereof by the complement conversion circuit 72, and converted by the shift registers, i.e., the P/S conversion circuit 73 from a parallel signal to a serial signal. The serial signal is output as a linear change signal from the P/S converter 73 to the D flip-flop 74. The D flip-flop 74 converts the serial signal to a log change signal. FIG. 7 shows an example of the results of conversion of a frequency change detection data ΔF to a linear change signal and a log change signal.

If the reception channel frequency of a radio frequency signal transmitted from a base station changes and the amount of change is relatively great, the value of a frequency change detection data ΔF output from the magnitude hold circuit 657 is also great, for example, "1111" as shown in FIG. 7. For this reason, the P/S conversion circuit 73 and the D flip-flop 74 output a linear change signal and a log change signal having a wide pulse width, i.e., a long duty cycle, as shown in FIG. 6(a), for example. At the same time, the change decision circuit 76 determines whether the value of the frequency change detection data ΔF is greater than a threshold value ΔFREF. If the frequency change detection data ΔF is the same as or greater than the threshold value ΔFREF, the change decision circuit 76 outputs a decision signal for selecting a log change signal. Accordingly, the gate circuit 75 selects the log change signal output from the D flip-flop 74, which is supplied as a frequency control signal FCS to the frequency synthesizer 4. In the frequency synthesizer 4, the log change signal is smoothed by a low-pass filter 42 and converted to a direct current. The PLL circuit 41 generates transmission and reception local oscillating frequencies in accordance with the value of the direct current. Therefore, if a log change signal having a wide pulse width is output as in this case, a direct current of a high level is supplied to the PLL circuit 41. As a result, the transmission and reception local oscillating frequencies generated from the PLL circuit 41 are raised, thereby correcting the transmission channel frequency. At this time, since the log change signal is selected as a frequency control signal FCS, the transmission and reception local oscillating frequencies generated from the PLL circuit 41 are corrected at a high speed.

On the other hand, if the reception channel frequency of a radio frequency signal transmitted from a base station changes less, the value of a frequency change detection data $\Delta F$ output from the magnitude hold circuit 657 is relatively small. For this reason, the P/S conversion circuit 73 and the D flip-flop 74 output a linear change signal and a log change signal having a narrow pulse width, i.e., a short duty cycle, as shown in FIG. 6(b), for example. If the frequency change detection data $\Delta F$ is smaller than the threshold value $\Delta FREF$, the change decision circuit 76 outputs a decision signal for selecting a linear change signal. Accordingly, the gate circuit 75 selects the linear change signal output from the P/S conversion circuit 73, which is supplied to the frequency synthesizer 4. Accordingly, a direct current of a low level corresponding to the linear change signal having the above-mentioned narrow pulse width is supplied to the PLL circuit 41. As a result, the transmission and reception local oscillating frequencies output from the PLL circuit 41 is corrected minutely and exactly.

As has been described above, according to this embodiment, a detection data $\Delta F$ representing a change of the reception channel frequency is detected by the synchronizing circuit 65 and input to the pulse width modulation circuit 70. The pulse-width modulated signal obtained by the pulse width modulation circuit 70 in accordance with the detection data $\Delta F$ is supplied as a frequency control signal FCS to the frequency synthesizer 4. Therefore, a D/A converter for converting the frequency change detection data $\Delta F$ obtained by the synchronizing circuit 65 to an analog signal is not required. Accordingly, the circuit structure of the Modem 6 is simple. In addition, since the circuit consumes low power, the service life of the battery is prolonged.

The pulse width modulation circuit 70 has only a small number of output terminals (corresponding to 1 bit) necessary for outputting a frequency control signal FCS, i.e., a pulse signal. Accordingly, the number of the output terminals of the Modem 6 is reduced as compared to the conventional apparatus, thereby decreasing the size of the package of the Modem 6.

Moreover, according to this embodiment, the pulse width modulation circuit 70 generates not only a linear change signal but also a log change signal. If the amount of frequency change $\Delta F$ is the same as or greater than a threshold value $\Delta FREF$, the log change signal is selected and output, and if the amount of frequency change $\Delta F$ is smaller than the threshold value $\Delta FREF$, the linear change signal is selected and output. For this reason, if the amount of frequency change $\Delta F$ is the same as or greater than the threshold value $\Delta FREF$, the transmission and reception local oscillating frequencies are quickly corrected by the log change signal, and if the frequency change $\Delta F$ is smaller than the threshold value $\Delta FREF$, the transmission and reception local oscillating frequencies are corrected minutely and exactly by the linear change signal.

This invention is not limited to the above embodiment. For example, the detection circuit may detect the difference between the reception channel frequency and the local oscillating frequency of the PLL circuit 41, to control the local oscillating frequency so as to make the difference constant. Further, the method of detecting the reception channel frequency, the structure of the pulse width modulating circuit, and the type and structure of the radio communication apparatus may be variously modified within the spirit and scope of the invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A radio communication apparatus used in a cellular radio system in which a communication signal is transmitted through a radio communication channel established between a base station and the radio communication apparatus, comprising:

detecting means for detecting a change of a received frequency of the communication signal transmitted through the radio communication channel during a communication to produce a digital detection signal;

pulse width modulating means for pulse width modulating a pulse signal having a predetermined frequency to vary linearly with the digital detection signal to produce a linear pulse-width modulated signal;

smoothing means for smoothing the linear pulse-width modulated signal thereby generating an analog control signal;

local oscillating means for generating a local oscillating signal whose frequency changes in accordance with the analog control signal; and mixing means for mixing the local oscillator signal with a transmission signal to produce a radio transmission signal.

2. A radio communication apparatus according to claim 1, wherein said detecting means and said pulse width modulating means are integrated together with a digital demodulating circuit for digital-demodulating a digital reception signal and outputting a digital reception baseband signal.

3. A radio communication apparatus according to claim 1, wherein said detecting means comprises storing means for storing a plurality of preset change detection patterns in accordance with the amounts of change of the received channel frequency, means for obtaining a correlation between an input digital reception signal and the change detection patterns stored in said storing means, and means for detecting an amount of frequency change of the received channel frequency on the basis of the obtained correlation.

4. A radio communication apparatus used in a cellular radio system in which a communication signal is transmitted through a radio communication channel established between a base station and the radio communication apparatus, comprising:

detecting means for detecting a change of a received frequency of the communication signal transmitted through the radio communication channel during a communication to produce a digital detection signal;

pulse width modulating means for pulse width modulating a pulse signal having a predetermined frequency to vary logarithmically with the digital detection signal to produce a log pulse-width modulated signal;

smoothing means for smoothing the log pulse-width modulated signal thereby generating an analog control signal;

local oscillating means for generating a local oscillating signal whose frequency changes in accordance with the analog control signal; and mixing means for mixing the local oscillator signal with a transmission signal to produce a radio transmission signal.

5. A radio communication apparatus according to claim 4, wherein said detecting means and said pulse width modulating means are integrated together with a digital demodulating circuit for digital-demodulating a digital reception signal and outputting a digital reception baseband signal.

6. A radio communication apparatus according to claim 4, wherein said detecting means comprises storing means for storing a plurality of preset change detection patterns in accordance with the amounts of change of the received channel frequency, means for obtaining a correlation between an input digital reception signal and the change detection patterns stored in said storing means, and means for detecting an amount of frequency change of the received channel frequency on the basis of the obtained correlation.

7. A radio communication apparatus used in a cellular radio system in which a communication signal is transmitted through a radio communication channel established between a base station and the radio communication apparatus, comprising:

detecting means for detecting a change of a received frequency of the communication signal transmitted through the radio communication channel during a communication to produce a digital detection signal;

pulse width modulating means for pulse width modulating a pulse signal having a predetermined frequency in accordance with the digital detection signal to produce a pulse-width modulated signal;

smoothing means for smoothing the log pulse-width modulated signal thereby generating an analog control signal;

local oscillating means for generating a local oscillating signal whose frequency changes in accordance with the analog control signal; and mixing means for mixing the local oscillator signal with a transmission signal to produce a radio transmission signal, wherein said pulse width modulating means comprises:

first pulse width modulating means for modulating the pulse signal to vary linearly with the digital detection signal to produce a linear pulse-width modulated signal;

second pulse width modulating means for modulating the pulse signal to vary logarithmically with the digital detection signal to produce a log pulse-width modulated signal;

comparing means for comparing the digital detection signal with a predetermined threshold value; and selecting means, responsive to said comparing means, for selecting the log pulse-width modulated signal from said second pulse width modulating means when the value represented by the digital detection signal is the same as or greater than the predetermined threshold value, for selecting the linear pulse-width modulated signal from said first pulse width modulating means when the value represented by the digital detection signal is less than the predetermined threshold value, and for outputting the selected signal to said smoothing means.

8. A radio communication apparatus according to claim 7, wherein said detecting means and said pulse width modulating means are integrated together with a digital demodulating circuit for digital-demodulating a digital reception signal and outputting a digital reception baseband signal.

9. A radio communication apparatus according to claim 7, wherein said detecting means comprises storing means for storing a plurality of preset change detection patterns in accordance with the amounts of change of the received channel frequency, means for obtaining a correlation between an input digital reception signal and the change detection patterns stored in said storing means, and means for detecting an amount of frequency change of the received channel frequency on the basis of the obtained correlation.

10. A radio communication apparatus, comprising:

detecting means for detecting a change of frequency of a received radio frequency signal and outputting a digital detection signal representing the amount of the change;

pulse width modulating means for pulse width modulating a pulse signal having a predetermined frequency to vary linearly with the digital detection signal to produce a linear pulse-width modulated signal;

control signal generating means for generating an analog control signal to control a transmission frequency in accordance with the linear pulse-width modulated signal; and radio transmission frequency generating means for generating a radio transmission frequency whose frequency varies in accordance with the analog control signal.

11. A radio communication apparatus, comprising:

detecting means for detecting a change of frequency of a received radio frequency signal and outputting a digital detection signal representing the amount of the change;

pulse width modulating means for pulse width modulating a pulse signal having a predetermined frequency to vary logarithmically with the digital detection signal to produce a log pulse-width modulated signal;

control signal generating means for generating an analog control signal to control a transmission frequency in accordance with the log pulse-width modulated signal; and radio transmission frequency generating means for generating a radio transmission frequency whose frequency varies in accordance with the analog control signal.

12. A radio communication apparatus, comprising:

detecting means for detecting a change of frequency of a received radio frequency signal and outputting a digital detection signal representing the amount of the change;

pulse width modulating means for pulse width modulating a pulse signal having a predetermined frequency in accordance with the digital detection signal to produce a pulse-width modulated signal;

control signal generating means for generating an analog control signal to control a transmission frequency in accordance with the pulse-width modulated signal; and radio transmission frequency generating means for generating a radio transmission frequency whose frequency varies in accordance with the analog control signal, wherein said pulse width modulating means comprises:

first pulse width modulating means for modulating the pulse signal to vary linearly with the digital detection signal to produce a linear pulse-width modulated signal;

second pulse width modulating means for modulating the pulse signal to vary logarithmically with the digital detection signal to produce a log pulse-width modulated signal;

comparing means for comparing the digital detection signal with a predetermined threshold value; and selecting means, responsive to said comparing means, for selecting the log pulse-width modulated signal from said second pulse width modulating means when the value represented by the digital detection signal is the same as or greater than the predetermined threshold value, for selecting the linear pulse-width modulated signal from said first pulse width modulating means when the value represented by the digital detection signal is less than the predetermined threshold value, and for outputting the selected signal to said smoothing means.

* * * * *